US010749474B2

(12) United States Patent
Botti et al.

(10) Patent No.: US 10,749,474 B2
(45) Date of Patent: Aug. 18, 2020

(54) SWITCHING CIRCUIT, CORRESPONDING DEVICE AND METHOD

(71) Applicant: STMicroelectronics S.r.l., Agrate Brianza (IT)

(72) Inventors: Edoardo Botti, Vigevano (IT); Giovanni Gonano, Padua (IT)

(73) Assignee: STMICROELECTRONICS S.R.L., Agrate Brianza (MB) (IT)

( * ) Notice: Subject to any disclaimer, the term of this patent is extended or adjusted under 35 U.S.C. 154(b) by 15 days.

(21) Appl. No.: 16/261,236

(22) Filed: Jan. 29, 2019

(65) Prior Publication Data

US 2019/0238094 A1 Aug. 1, 2019

(30) Foreign Application Priority Data

Jan. 31, 2018 (IT) .................. 102018000002255

(51) Int. Cl.
*H03F 3/217* (2006.01)
*H03F 1/02* (2006.01)
*H03F 1/32* (2006.01)

(52) U.S. Cl.
CPC ......... *H03F 1/0205* (2013.01); *H03F 1/3205* (2013.01); *H03F 3/2171* (2013.01); *H03F 3/2173* (2013.01); *H03F 2200/171* (2013.01); *H03F 2201/3215* (2013.01)

(58) Field of Classification Search
CPC ...................................... H03F 3/217
USPC ........................ 330/251, 207 A, 10
See application file for complete search history.

(56) References Cited

U.S. PATENT DOCUMENTS

| 4,953,068 | A | 8/1990 | Henze |
| 6,108,218 | A | 8/2000 | Igarashi et al. |
| 8,026,704 | B2 | 9/2011 | Kapels et al. |
| 8,942,018 | B2 | 1/2015 | Ho et al. |
| 9,240,729 | B2 * | 1/2016 | Kenny ............... H02M 3/3376 |
| 9,979,354 | B2 * | 5/2018 | Hoyerby ............... H03F 3/2173 |

(Continued)

FOREIGN PATENT DOCUMENTS

| CN | 201018423 Y | 2/2008 |
| CN | 101814840 A | 8/2010 |
| WO | 2009153965 A1 | 12/2009 |

OTHER PUBLICATIONS

Andreycak, B, "Zero Voltage Switching Resonant Power Conversion", Unitrode Application Note, U-138, Sep. 5, 1999, 28 pages.

(Continued)

*Primary Examiner* — Henry Choe
(74) *Attorney, Agent, or Firm* — Slater Matsil, LLP

(57) ABSTRACT

A switching circuit includes a switching circuit stage configured to supply a load via filter networks. Control circuitry is provided to control alternate switching sequences of transistors in the half-bridges of the switching circuit stage. A current flow line is provided between the output nodes of the half-bridges including an inductance between two switches. First and second capacitances are coupled with the output nodes of the half-bridges. The control circuitry switches first and second switches to the conductive state at intervals in the alternate switching sequences of the transistors in the half-bridges between switching the first pair of transistors to a non-conductive state and switching the second pair of transistors to a conductive state.

20 Claims, 13 Drawing Sheets

(56) References Cited

U.S. PATENT DOCUMENTS

| | | | |
|---|---|---|---|
| 9,985,546 B2 | 5/2018 | Jitaru | |
| 2002/0126509 A1 | 9/2002 | Liang | |
| 2007/0115055 A1 | 5/2007 | Mendenhall | |
| 2008/0143421 A1 | 6/2008 | Yanagihara et al. | |
| 2008/0310046 A1* | 12/2008 | Menegoli | G11B 21/02 360/75 |
| 2012/0044020 A1* | 2/2012 | Siniscalchi | H03F 3/2173 330/251 |
| 2012/0057387 A1 | 3/2012 | Lai et al. | |
| 2012/0218785 A1 | 8/2012 | Li et al. | |
| 2013/0223651 A1* | 8/2013 | Hoyerby | H03F 3/2173 381/120 |
| 2015/0023063 A1 | 1/2015 | Perreault et al. | |
| 2015/0069855 A1 | 3/2015 | De Rooij et al. | |
| 2016/0020701 A1 | 1/2016 | Jitaru | |

OTHER PUBLICATIONS

Choi, Hang-Seok, et al., "Novel Zero-Voltage and Zero-Current-Switching (ZVZCS) Full-Bridge PWM Converter Using Coupled Output Inductor", Browse Journals & Magazines, IEEE Transactions on Power EI, vol. 17 Issue 5, Sep. 2002, 8 pages.

Choi, Hang-Seok, et al., "Novel Zero-Voltage and Zero-Current-Switching (ZVZCS) Full-Bridge PWM Converter Using Coupled Output Inductor", Departement of Electrical Engineering, Seoul National University, Seoul, Korea, Nov. 7, 2002, 7 pages.

Dudrik, J. et al., "High-Frequency Soft-Switching DC-DC Conterters for Voltage and Current DC Power Sources", Department of Electrical, Mechatronic and Industrial Engineering, Acta Polytechnica Hungarican, vol. 4, No. 2, Aug. 2007, 18 pages.

Walters, E.A., "Analysis of the Auxiliary Resonant Commutated Pole Inverter", XP055506334, Purdue University, Purdue e-Pubs, ECE Technical Reports, Jan. 8, 1995, 67 pages.

Perdul'ak, J. et al., "Novel Zero-Voltage and Zero-Current Switching Full-Bridge PWM Converter Using Simple Secondary Active Clamp Circuit", Dept. of Electrical Engineering, Mechatronics and Industrial Engineering, FEI TU of Kosice, Slovak Republic, Oct. 23-26, 2010, 4 pages.

Texas Instruments, "Phase-Shifted Full Bridge DC/DC Power Converter Design Guide", TIDU248—May 2017, 56 pages.

Texas Instruments, "Phase-Shifted Full-Bridge, Zero-Voltage Transition Design Considerations", Application Report Literature No. SLUA07A, Sep. 1999—Revised Aug. 2011, 19 pages.

* cited by examiner

Initial condition:
VL1=VH2=1
VH1=VL2=0
Vcs1=Vcs2=0

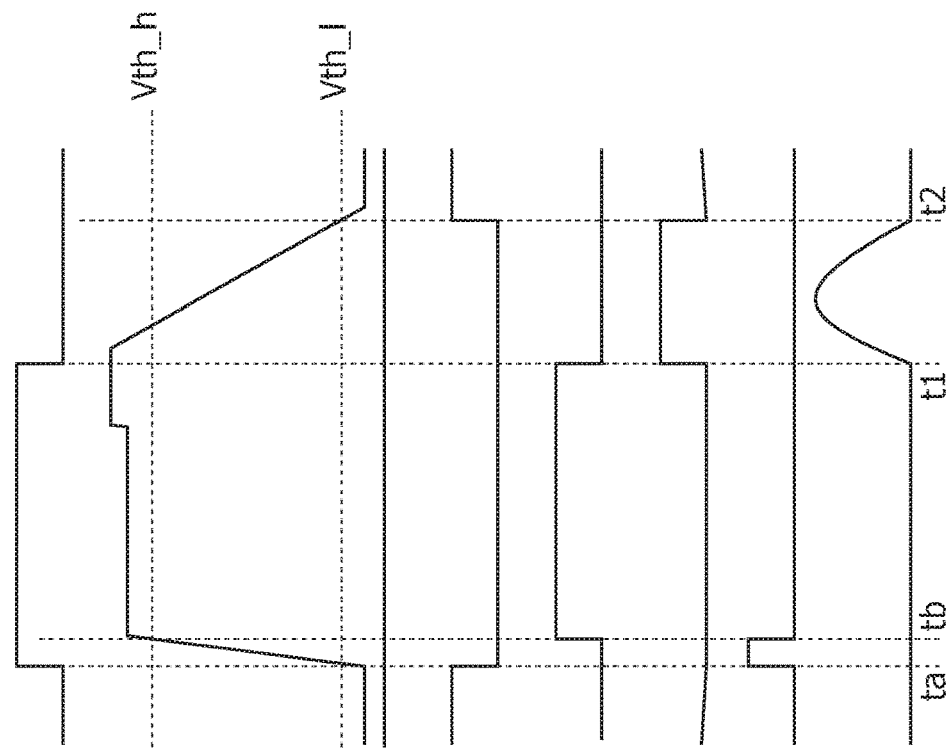
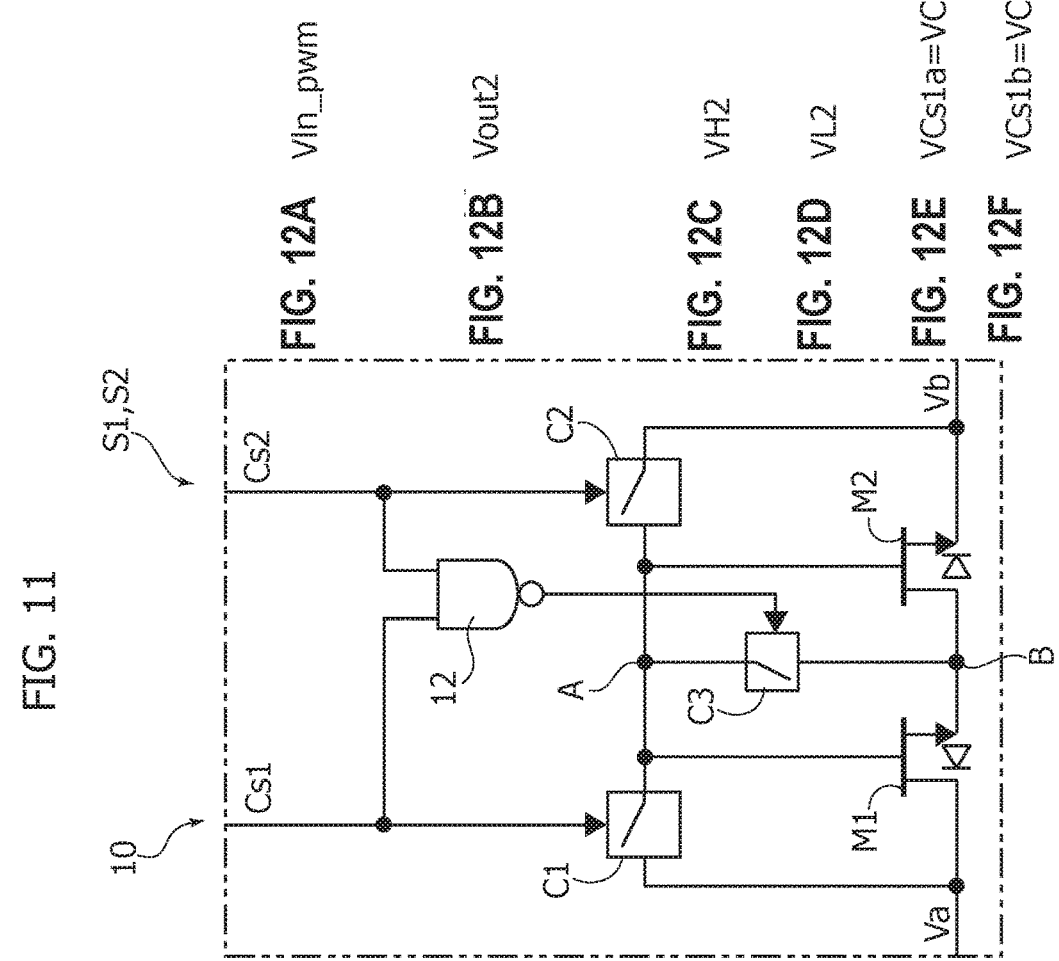
FIG. 11
FIG. 12A Vin_pwm
FIG. 12B Vout2
FIG. 12C VH2
FIG. 12D VL2
FIG. 12E VCs1a=VCs2b
FIG. 12F VCs1b=VCs2a
FIG. 12G ILaux

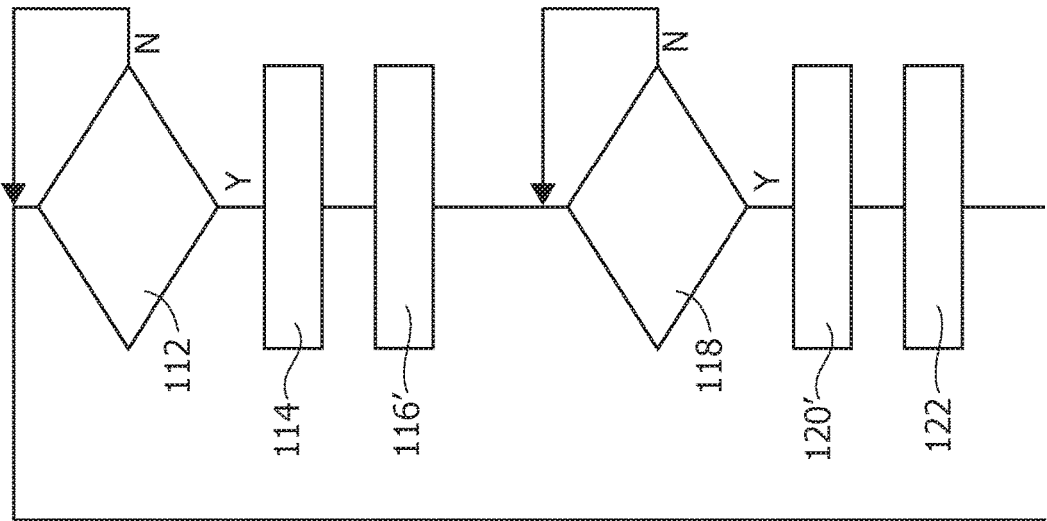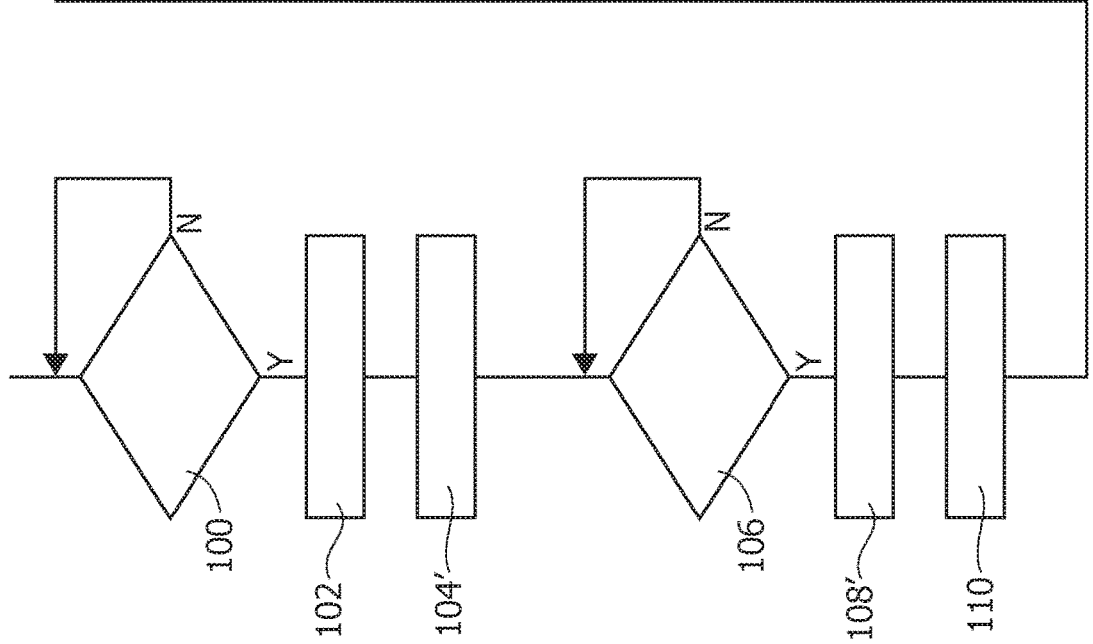
FIG. 14
Initial condition:
VL1=VH2=1
VH1=VL2=0
Vcs1a=Vcs2b=0
Vcs1b=Vcs2a=0

SWITCHING CIRCUIT, CORRESPONDING DEVICE AND METHOD

CROSS-REFERENCE TO RELATED APPLICATIONS

This application claims priority to Italian Patent Application No. 102018000002255, filed on Jan. 31, 2018, which application is hereby incorporated herein by reference.

TECHNICAL FIELD

The present invention relates generally to an electronic system and method, and, in particular embodiments, to a switching circuit, corresponding device and method.

BACKGROUND

Efficiency and low distortion are desirable parameters in switching circuits such as class-D audio power amplifiers.

A trend currently exists in that area towards increasing the switching frequency from, e.g., 350 kHz to, e.g., about 2 MHz. An increased switching frequency may, however, have a negative impact on efficiency and distortion, particularly due to losses related to switching and the effects of the so-called "dead time."

SUMMARY

Some embodiments relate to a switching circuit with increased switching frequency (e.g., about 2 MHz) with reduced switching power dissipation and improved linearity (low distortion).

In some embodiments, the switching circuit is a switching (Class-D) audio power amplifier.

One or more embodiments may relate to a corresponding method.

One or more embodiments may rely on the concept of avoiding the simultaneous presence of high voltages and high circulating currents through the power transistors in the bridge structure of a switching circuit such as a class-D.

One or more embodiments may exploit the resonance of an inductance and associated capacitances made possible by switching auxiliary switches.

In one or more embodiments, the small values of these elements may make it possible to exploit the intrinsic capacitors of the bridge power transistors to provide such capacitances while the inductance resonating therewith may be provided by electrically-conductive lines (e.g., copper tracks) in the printed circuit board of the circuit.

One or more embodiments can thus be implemented without adding external inductive/capacitive components to standard solutions while maintaining the advantages related to reduced dissipated power and improved linearity (low distortion).

BRIEF DESCRIPTION OF THE DRAWINGS

One or more embodiments will now be described, by way of example only, with reference to the annexed figures, wherein:

FIGS. 6 to 11 are exemplary of various possible implementation details of embodiments, FIGS. 12A-12G are exemplary of certain signals which may occur in embodiments, FIG. 14 is a flow chart exemplary of possible operation of embodiments.

DETAILED DESCRIPTION OF ILLUSTRATIVE EMBODIMENTS

In the ensuing description, one or more specific details are illustrated, aimed at providing an in-depth understanding of examples of embodiments of this description. The embodiments may be obtained without one or more of the specific details, or with other methods, components, materials, etc. In other cases, known structures, materials, or operations are not illustrated or described in detail so that certain aspects of embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment" or "in one embodiment" that may be present in one or more points of the present description do not necessarily refer to one and the same embodiment. Moreover, particular conformations, structures, or characteristics may be combined in any adequate way in one or more embodiments.

The references used herein are provided merely for convenience and hence do not define the extent of protection or the scope of the embodiments.

Figure 1:
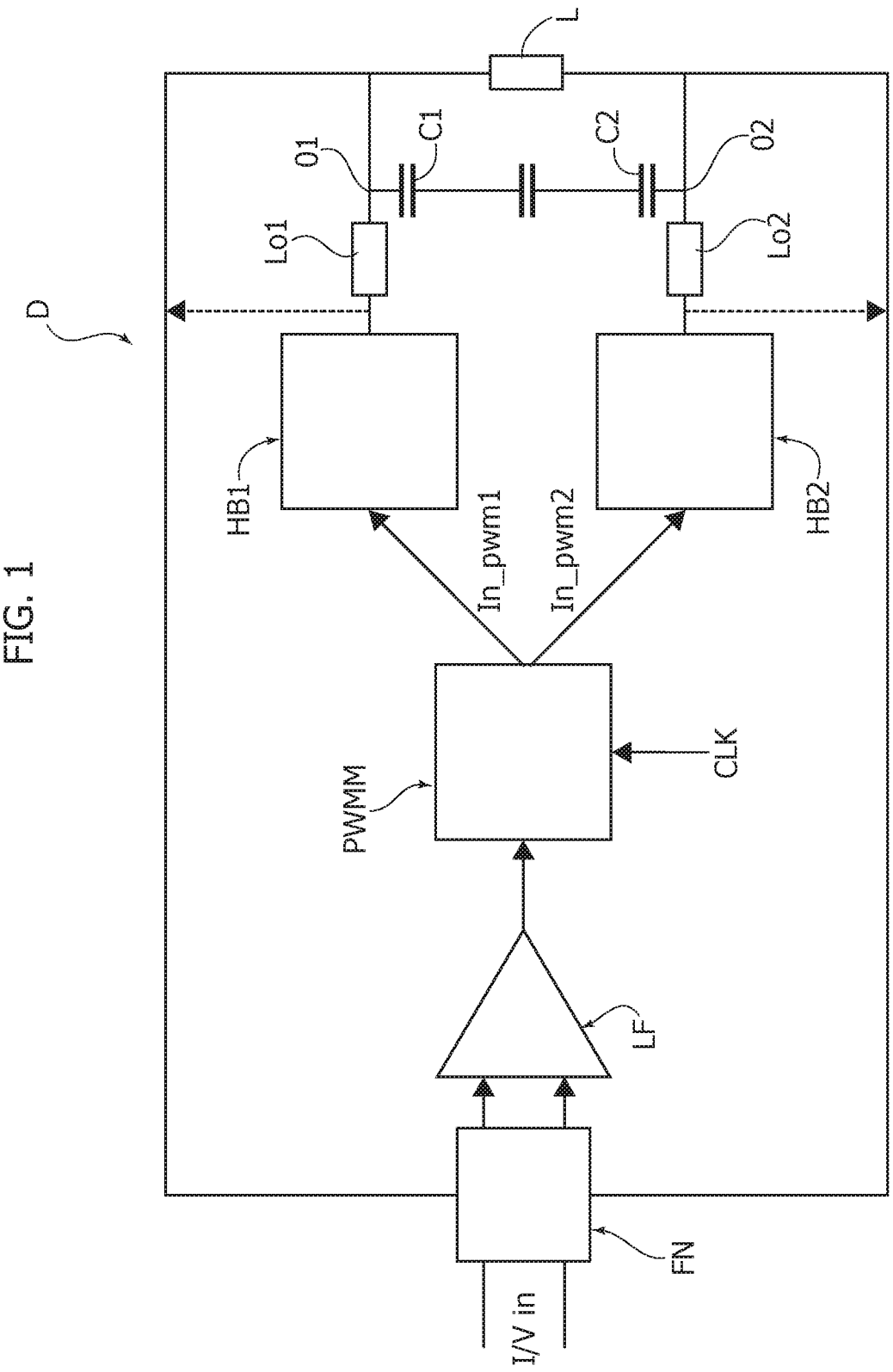
FIG. 1 is an exemplary block diagram of a switching circuit such as a switching amplifier.

FIG. 1 is exemplary block diagrams of a switching circuit D such as a class-D audio amplifier (for use, e.g., in a car audio system) including a switching bridge architecture.

In such a circuit a (voltage or current) input signal I/V in is applied (e.g., via a feedback network FN) to a loop filter LF which facilitates system stability while negative feedback (as implemented at FN) is intended to improve the amplitude and the frequency linearity.

The output from the loop filter LF is fed to a pulse width modulation (PWM) modulator PWMM clocked by a clock signal CLK. The modulator PWMM generates a two-level signal whose average value is proportional to the input signal I/V in, with a (fixed frequency) carrier defined by the clock signal CLK.

Two half-bridge circuits HB1, HB2 (driven by the modulator PWMM via two signals In_pwm1, In_pvm2) provide a PWM-modulated power signal across an LC output filter network comprising, e.g., respective inductances Lo1, Lo2 and capacitances C1, C2 in a mirror-symmetrical configuration.

In a class-D bridge circuit as considered herein the signals In_pwm1 and In_pwm2 (and, consequently the outputs from half-bridges HB1, HB2) will have opposed phases (namely 180° phase shift): that is, either one of the signals In_pwm1 and In_pwm2 is a "negated" replica of the other.

An amplified version of the input signal I/V in will thus become available at a load L coupled across a first node O1 between the inductance Lo1 and the capacitance C1 and a second node O2 between the inductance Lo2 and the capacitance C2.

The circuit arrangement exemplified in FIG. 1 is otherwise conventional in the art, thus making it unnecessary to provide a more detailed description herein.

As noted, efficiency and distortion (primarily total harmonic distortion or THD) are significant parameters for switching circuits such as class-D audio amplifiers.

As similarly noted, a trend currently exist to increase the switching frequency of class-D audio amplifiers by moving from, e.g., 350 kHz to, e.g., 2.2-2.5 MHz.

Such a trend pursues a twofold goal: the inductances in the output filter network (e.g., Lo1, C1, Lo2, C2) can be reduced in value, thus leading to smaller dimensions; and obtaining a more favorable electromagnetic emission spectrum, thus improving electromagnetic interference (EMI) performance.

Such a trend towards higher switching frequencies may entail negative effects on both efficiency and distortion.

Efficiency may be reduced as a consequence of an increase in the power dissipated. This is due to the increase of the number of transitions in the output square wave for each time unit, this resulting in increased switching losses.

Distortion may also increase insofar as each transition has an associated error in the output square wave. This is primarily due to a "dead time," namely the time interval occurring between turning-off one of the power transistors (e.g., the low-side driver or LSD) and turning-on another power transistor (e.g., the high-side driver or HSD) in the half-bridge HB1, HB2.

Such a dead time is intended to avoid cross-conduction of the power transistors that are alternatively switched on and off. As a result of the increase in the number of transitions (switching) per time unit, the percentage error correspondingly increases. Even with other factors unaffected, this entails an increase in distortion (THD).

By referring, for instance, to the representation of HB1 and HB2 in FIG. 2 (discussed later) one may note that, e.g., a 1→0 transition in In_pwm1 may turn off a high-side transistor H1. In order to avoid a cross-conduction with the corresponding low-side transistor L1, the low-side transistor L1 is turned on (only) after a dead time Dt1.

Due to the direction of current flow, the electromotive force of Lo1 may bring autonomously the output towards ground even though the low-side transistor L1 has not been turned on yet. As a result, the output is "clamped" by the body diode associated with L1 to a voltage slightly lower than the ground level.

Once L1 is turned on (after the dead time Dt1), the signal Vout1 from the half-bridge HB1 reaches a voltage (under the ground level) given by Iout1*Rds(on)H1 where Iout1 denotes the output current and Rds(on)H1 denotes the drain-source "on" resistance of that transistor, namely H1 (e.g., a MOSFET transistor).

When In_pwm1 returns to the high-level (0→1), L1 is turned off and the associated body diode becomes again conductive.

Then H1 is again turned on (after a dead time Dt2) and the output will reach the supply voltage Vdd only as a result of H1 having discharged (completely) the "recovery stored charge" Qrr of the body diode of L1. This may give rise to current peaks in H1 largely in excess of Iout1.

Such a peak (which is also a function of the discharge speed) has two effects: a high dissipation in H1, insofar as at that time the Vds (drain-source voltage drop) is about equal to the supply voltage Vdd; and prior to the output reaching again a high level, in addition to the dead time Dt2, a further time DtQrr will lapse related to the discharge of the body diode in direct (forward) conduction.

The same remarks apply in a complementary way to the half-bridge HB2.

To sum up, insofar as harmonic distortion (THD) is concerned, one may note that the difference between the duty cycle of the signals In_pwm1, In_pwm2 and the corresponding output power signal is primarily related to DtQrr (as a function of the direction of current flow) and gives rise to a crossover distortion which cannot be completely absorbed by the feedback circuit FN. Concerning power dissipation, one may note that, in addition to the power dissipated by conduction during the time intervals where the output voltage is "solidary" with Vdd or Gnd (this power being equal to $Rds(on)*Id^2$ or $V(bodydiode)*Id$) further power is dissipated due to switching during transitions of the output signal from Vdd to Gnd or vice-versa.

A significant contribution to power dissipation in conventional arrangements as exemplified in the foregoing is the transition where the transistor which is in the process of being activated discharges the charge stored in the body diode. If the transition is a fast one, such a current may be appreciably higher than Iout. This leads to a correspondingly high power dissipation insofar as the drain-source voltage Vds is nearly equal to Vdd (the supply voltage of the two half-bridges HB1, HB2—see, e.g., FIG. 2).

If one considers that the two half-bridges HB1, HB2 may switch simultaneously, such a critical transition may take place likewise simultaneously with a correspondingly high current flow.

One or more embodiments facilitate providing a circuit suited for use, e.g., in a class-D audio amplifier of the monolithic type having high switching frequency (e.g., above 2 MHz) with the capability of reducing the amount of power dissipated as a result of switching (e.g., due to the critical transitions discussed previously) while improving linearity.

One or more embodiments also facilitate reducing the number of components which may be used for that purpose.

It is noted that reducing dissipation has been addressed in the art in the area of power inverters as witnessed, e.g., by Walters Eric A., et al.; "ANALYSIS OF THE AUXILIARY RESONANT COMMUTATED POLE INVERTER" (1995), *ECE Technical Reports*. Paper 142, available at http://does.lib.purdue.edu/ecetr/142.

Figure 2:
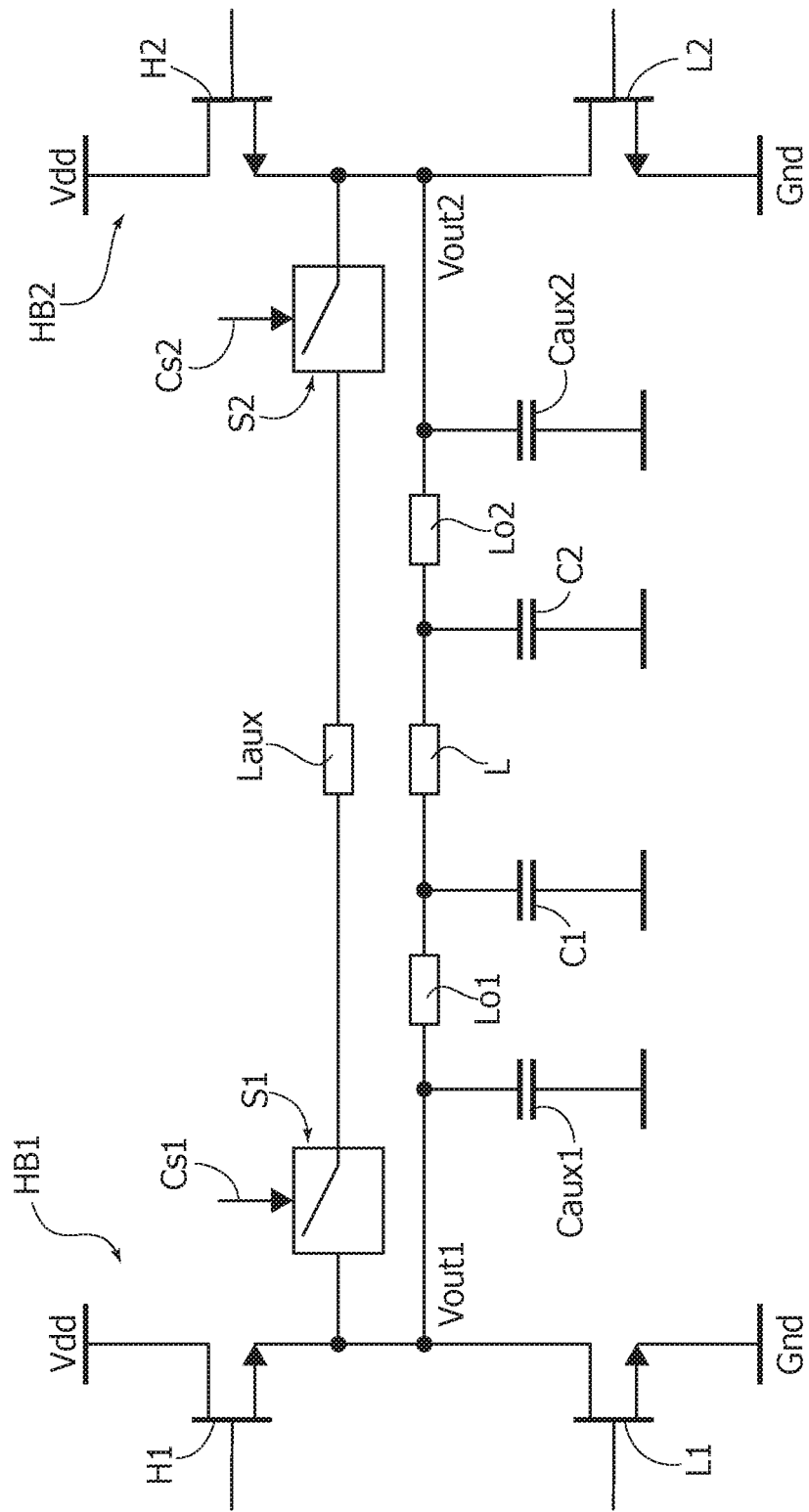
FIG. 2 is a circuit diagram exemplary of embodiments.

FIG. 2 is exemplary of a general circuit layout in one or more embodiments. In FIG. 2, the half-bridges HB1, HB2 (to which the drive signals In_pwm1, Im_pwm2 are applied) are schematically represented as including respective "high side" and "low side" power transistors (e.g., power MOS transistors) H1, L1 (half-bridge HB1) and H2, L2 (half-bridge HB2) with respective intermediate nodes at which voltages Vout1, Vout2 are present.

These nodes (hereinafter, for brevity, Vout1, Vout2) are shown having the load L arranged therebetween with the low-pass LC filters Lo1, C1 (half-bridge HB1) and Lo2, C2 (half-bridge HB2) also shown.

It will be otherwise appreciated that the load L (and possibly the LC filter networks) may be a distinct element from the embodiments.

The two nodes Vout1, Vout2 will hereinafter be referred to as the "output" nodes (of the half-bridges HB1, HB2) even though, strictly speaking, they do not represent the output nodes O1, O2 of the device D (see, e.g., FIG. 1) having the load L coupled therebetween.

According to one or more embodiments, an electrical line is provided linking the "output" nodes in HB1 and HB2 between the high-side transistor H1, H2 and the low-side transistor L1, L2, that is the nodes/lines where the signals Vout1 and Vout2 occur.

The line between these nodes (for the sake of brevity, these two nodes will be identified in the following simply as Vout1 and Vout2) comprises an inductance Laux and two switches S1, S2. These may be controlled by respective signals (e.g., Cs1, Cs2) as discussed in the following.

The opposed terminals of Laux are coupled to S1 and S2; that is, Laux is set between S1 and S2. Consequently, the switch S1 will control coupling of the inductance Laux with the output Vout1 (half-bridge HB1) and the switch S2 will control coupling of the inductance Laux with the output Vout2 (half-bridge HB2).

In one or more embodiments, the switches S1, S2 can be incorporated in the same (monolithic) integrated circuit of the amplifier (see FIG. 1).

In one or more embodiments, the inductance Laux can be implemented as a distinct, e.g., external component.

In one or more embodiments, however, the inductance Laux can be provided (at least in part) as an electrically conductive formation (line or track) on a printed circuit board hosting the circuit discussed herein, thus making it unnecessary to provide a distinct component for that purpose.

The representation of FIG. 2 also includes two further capacitances Caux1, Caux2 between the outputs Vout1, Vout2 respectively and ground.

Similarly to the inductance Laux, the capacitances Caux1, Caux2 can be provided as distinct, e.g., external, components.

In one or more embodiments, however, the capacitances Caux1, Caux2 can be provided (at least in part) by the parasitic capacitances of the transistors H1, L1 (Caux1) and H2, L2 (Caux2), respectively, thus making it unnecessary to provide distinct components for that purpose.

Figure 3:
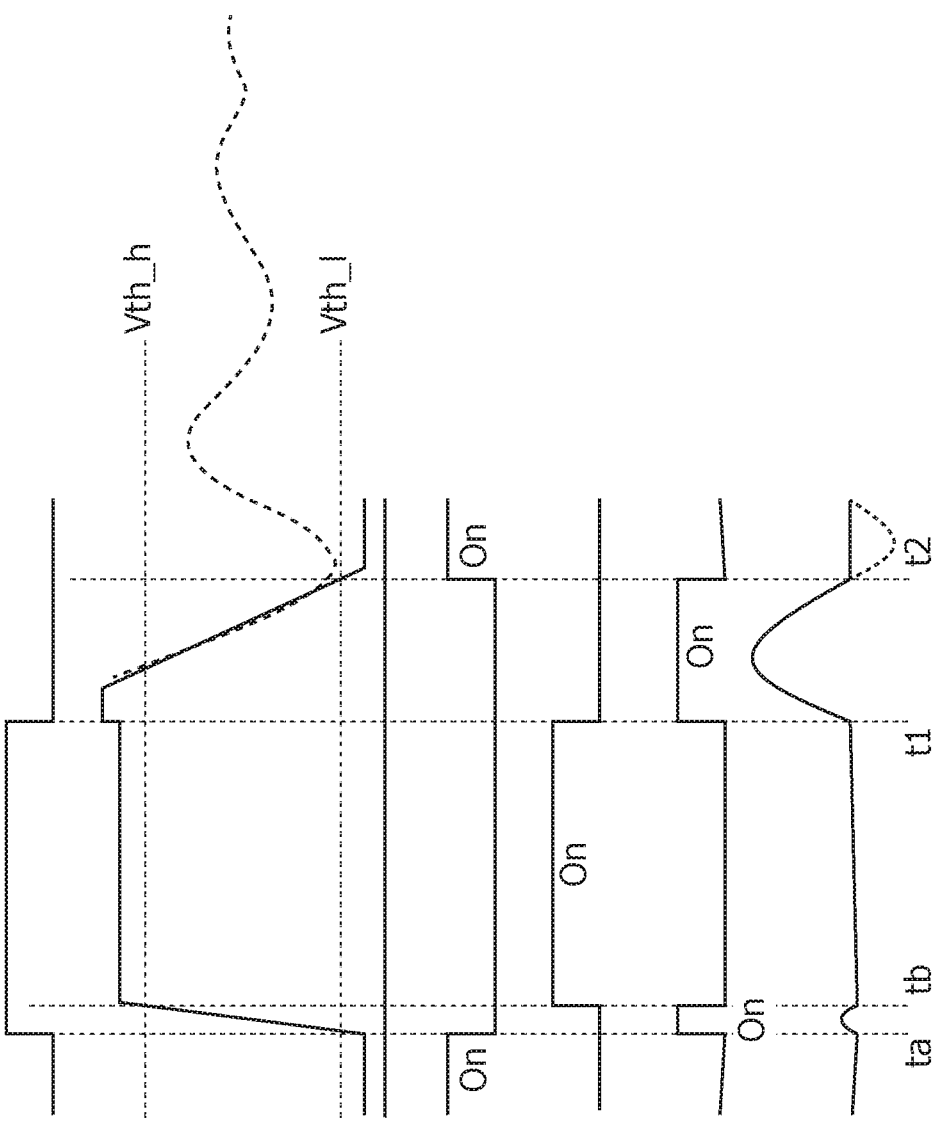
FIGS. 3A-3F are exemplary of certain signals which may occur in embodiments.

The diagrams in FIGS. 3A-3F are exemplary of a possible time behavior of various signals in embodiments, assuming (as it may reasonably be the case) complementary PWM-modulated behaviors of In_pwm1 and In_pwm2 (generally labeled In_pwm in FIG. 3A).

In FIG. 3B, the behavior of the signal Vout2 is shown: the signal Vout1 will exhibit the same behavior in a complementary manner, that is, with Vout1 "low" when Vout2 is "high" and Vout2 "low" when Vout1 is "high."

FIGS. 3C and 3D portray the on and off conditions of the high-side and low-side transistors (H2 and L2, respectively) in the half-bridge HB2.

FIG. 3E portrays possible control signals Cs1=Cs2 applied to the switches S1 and S2, by assuming that an "On" value corresponds to the associated switch being made conductive.

FIG. 3F exemplifies a possible time behavior of the current ILaux through the auxiliary inductance Laux.

For the sake of brevity, only the behavior of the half-bridge HB2 (including the high-side transistor H2 and the low-side transistor L2) is exemplified in FIGS. 3A-3F. As noted, the same behavior is in fact mirrored in the half-bridge HB1 in a complementary way (180° phase offset) due to the complementary time behavior of In_pwm1 and In_pwm2.

Figure 4:
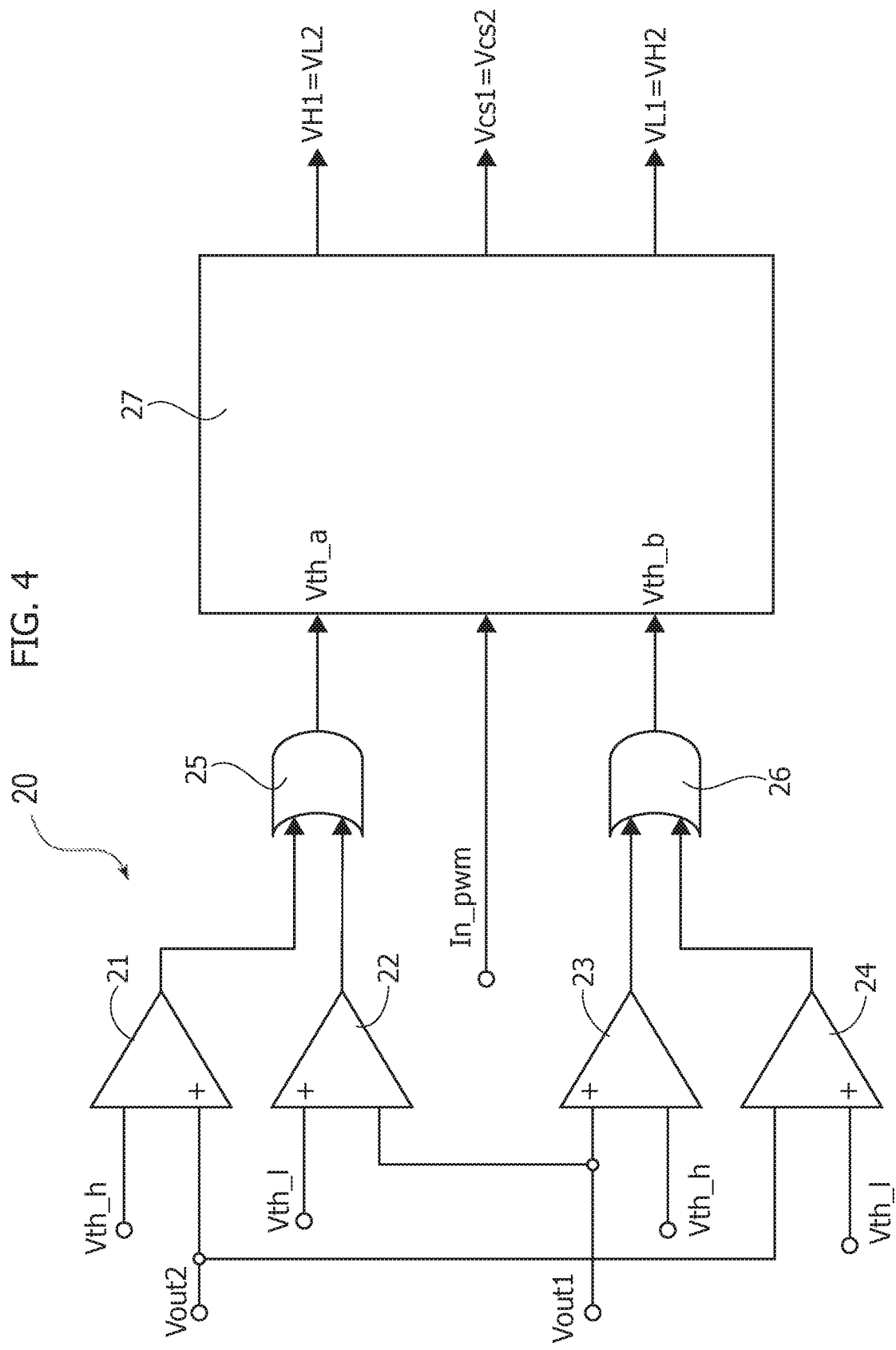
FIG. 4 is exemplary of a possible control arrangement in embodiments.

That is, the high-side transistor H2 in HB2 being alternatively turned off (made non-conductive) and on (made conductive), as illustrated in FIG. 3C, is mirrored by the low-side transistor L1 in HB1 being correspondingly turned off (made non-conductive) and on (made conductive) by corresponding drive signals VL1=VH2 applied to the respective control terminals (e.g., gates) with these control signals generated, e.g., by a control block 27 as shown in FIG. 4 (discussed in the following). The low-side transistor L2 in HB2 being alternatively turned on (made conductive) and off (made non-conductive), as illustrated in FIG. 3D, is mirrored by the high-side transistor L1 in HB1 being correspondingly turned on (made conductive) and off (made non-conductive) by corresponding drive signals VH1=VL2 applied to the respective control terminals (e.g., gates) with these control signals generated, e.g., as shown in FIG. 4.

This type of operation (including alternate switching sequences of the high-side transistors H1, H2 and the low-side transistors L1, L2 in the half-bridges HB1, HB2 where: a first pair of transistors comprising the high-side transistor (H2 resp. H1) in one (HB2 resp. HB1) of the half-bridges and the low-side transistor (L1 resp. L2) in the other (HB1 resp. HB2) of the half-bridges is switched to a non-conductive state, and a second pair of transistors comprising the high-side transistor (H1 resp. H2) in the other (HB1 resp. HB2) of the half-bridges and a low-side transistor (L2 resp. L1) in the one (HB2 resp. HB1) of the half-bridges (HB1, HB2) is switched to a conductive state) is conventional in the art, thus making it unnecessary to provide a more detailed description herein.

As shown, e.g., in FIG. 3E, the switches S1 and S2 are activated (that is turned on, namely made conductive) via signals Cs1 and Cs2 during the time periods ta-tb and t1-t2 where, in the alternate switching sequences discussed previously, both transistor pairs are non-conductive, namely, with the first pair brought to the non-conductive state and the second pair not yet in the conductive state.

For instance, in FIGS. 3A-3F:

ta-tb is the interval where H2 has been turned off and L2 is not turned on yet; and t1-t2 is the interval where L2 has been turned off and H2 is not turned on yet.

In one or more embodiments, the instants ta and t1 where the switches S1 and S2 are turned on (made conductive) can be timed by the corresponding transitions (e.g., 0→1 and 1→0) of the In_pwm signals. Conversely, the instants tb and t2 where the switches S1 and S2 are turned off (made non-conductive) may be controlled (also) by comparing the signal at the node between the high-side and the low-side transistor (in FIGS. 3A-3F, the signal Vout2 between H2 and L2 is exemplified) as a function of two threshold values Vth_h (upper threshold) and Vth_l (lower threshold).

More specifically, as exemplified in FIGS. 3A-3F:

the switches S1, S2 are turned off at time tb as a result of Vout2>Vth_h, and the switches S1 and S2 are turned off at time t2 as a result of Vout2<Vth_l.

The inductance Laux and the capacitances Caux1 and Caux2 act as a resonant circuit which imparts to the current ILaux through the inductance Laux after ta and t1 an arc-shaped behavior which is substantially sinusoidal, e.g., as shown in full line after t1 in the right-hand side of FIG. 3F.

The diagram of FIG. 4 is exemplary of a control circuitry 20 including four comparators 21, 22, 23, 24 that compare the signals Vout1, Vout2 at the nodes between the high-side and the low-side transistors (H1, H2 and L1, L2, respectively) with threshold values Vth_h, Vth_l which may be made possibly adjustable as setting parameters of the circuit.

For instance, in an embodiment as exemplified in FIG. 4 the possible connection of the comparators 21 to 24 may comprise:

comparator 21:
Vout2—non inverting input,
Vth_h inverting input
comparator 22:
Vout1—inverting input,
Vth_l—non inverting input
comparator 23:
Vout1—non inverting input,
Vth_h—inverting input
comparator 24:
Vout2—inverting input,
Vth_l—non inverting input.

The outputs from the comparators 21, 22 and the outputs from the comparators 23 and 24 are input to OR gates 25, 26 that provide corresponding signals to respective inputs of a control circuit block 27 which switches the switches S1, S2 on (conductive state) and off (non-conductive state).

For instance, the signals from the OR gates 25, 26 may provide to the circuit block 27 two input signals at Vth_a and Vth_b which facilitate turning off the switches S1, S2 as discussed previously while turning on of these switches may be controlled by the rising/falling edges of either one of the signals In_pwm1 or In_pwm2. For that reason the generic indication In_pwm without suffixes 1 or 2 is reproduced in FIG. 27.

In the diagram of FIG. 4 three output lines are exemplified from the control circuit 27 corresponding to:

VH1=VL2 are the control signals applied to the control terminals (e.g., gates) of the power transistor H1 and L2;
VL1=VH2 are the control signals applied to the control terminals (e.g., gates) of the power transistor L1 and H2; and
Vcs1=Vcs2 are the control signal of the switches S1 and S2.

While other choices are of course possible (as well known to those of skill in the art), for the sake of explanation and by way of example it may be assumed that the transistors/switches are "on" (active/conductive) when the control signal is "high" and "off" (inactive/non-conductive) when the control signal is "low".

Figure 5:
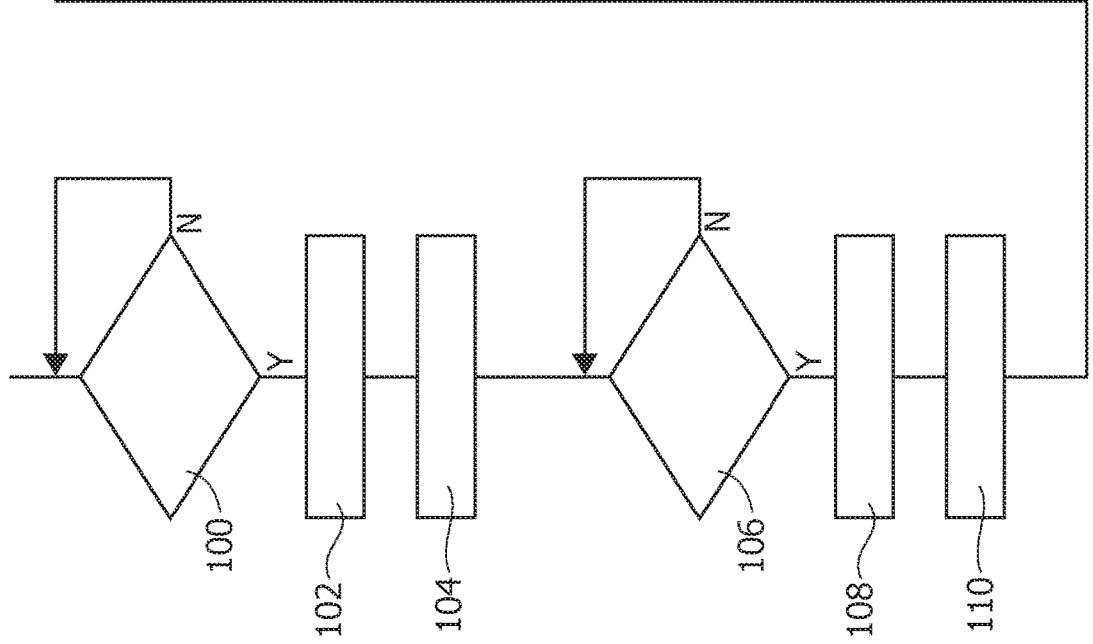
FIG. 5 is a flow chart exemplary of a possible operation of embodiments.

The flow chart in FIG. 5 is exemplary of possible cyclical operation of an arrangement as discussed in the foregoing, starting to an initial condition where:

VL1=VH2=1 (that is, L1 and H2 conductive)
VH1=VL2=0 (that is, H1 and L2 non-conductive)
Vcs1=Vcs2=0 (that is, S1 and S2 non-conductive).

The blocks in the diagram of FIG. 5 identify the following acts:

100: check as to whether a transition (e.g., 0→1) has occurred in the input signal In_pwm (here again the suffixes 1 and 2 are not reproduced for the reasons given previously);
102: given a positive outcome in block 100, the currently active power transistors are turned off (e.g., VL1=VH2 1→0);
104: the switches CS1-CS2 are activated, that is made conductive (e.g., Vcs1=Vcs2 0→1);
106: check as to whether the "turn-off" threshold has been reached (e.g., Vth_a 0→1);
108: given a positive outcome in block 106, the switches S1, S2 are turned off, that is made non-conductive (e.g., Vcs1=Vcs2 1→0);
110: the currently inactive power transistors are turned on (e.g., VH1=VL2 0→1);
112: check as to whether a new transition has occurred in the input signal In_pwm;
114: given a positive outcome in block 112, the currently active power transistors are turned off (e.g., VH1=VL2 1→0);
116: the switches CS1-CS2 are activated, that is made conductive (e.g., Vcs1=Vcs2 0→1);
118: check as to whether the "turn-off" threshold has been reached (e.g., Vth_b 0→1);
120: given a positive outcome in block 116, the switches S1, S2 are turned off, that is made non-conductive (e.g., Vcs1=Vcs2 1→0); and
122: the currently inactive power transistors are turned on (e.g., VL1=VH2 0→1); and so on.

Even assuming that the current peak related to discharging the body diodes (e.g., those of the transistors which are being turned on—that is, made conductive) may have a value comparable with that of conventional solutions, one or more embodiments may provide a first advantage in that the corresponding current will flow through a single line between Vdd and ground (namely the line through Laux and the switches S1, S2—made conductive).

This alone may facilitate halving the power dissipated during the interval between t1 and t2 (see the diagram of FIGS. 3A-3F).

Another factor which facilitates reducing power dissipation during that interval concerns the voltage across the switches S1 and S2. These switches close (that is, become conductive) at notionally zero current which results in notionally no power being dissipated, with the voltage (at time t1) being almost entirely across Laux.

Also, the time behavior of the current ILaux through Laux facilitates dispensing with (or at least appreciably reducing) the dead time between power transistor turn-off and switching on the switches S1, S2: possible cross-conduction will in fact follow the time behavior of ILaux being thus being nil at the outset and then rising relatively slowly with a well defined slope proportional to VCC/Laux (that is, no longer a function of the discharge times of Qrr—see the previous discussion).

At time t2, when the output reaches the lower threshold Vth_l the two switches S1 and S2 are turned off (made non-conductive): in that condition the current ILaux through Laux tends to become zero.

It will be appreciated that, if the current line or path through Laux were not interrupted due to S1, S2 becoming non-conductive, the voltage Vout2 would follow a damped oscillating behavior as exemplified by a dashed line in FIG. 3B.

Still another advantage of one or more embodiments lies in (amplitude) linearity. Due to the (at least notional) absence of any dead time, the output signal waveforms will exhibit a (much) lower distortion as a function of the direction of flow of the current.

For instance, in the exemplary case of a class-D amplifier with integrated silicon power transistors (e.g., MOS transistors) with a PWM switching frequency set at 2 MHz and switching times of the order of 15 ns, the distortion in the modulator becomes less than 10% (in comparison with a 50% in conventional arrangements). This may be related, e.g., to the relationship between PWMin and PWout becoming more gradual and continuous than the one which is experienced in the presence of dead times.

Even in the presence of a high feedback factors (which may be adopted in the presence of a LC output filter operating at higher frequencies) the transfer function of one or more embodiments will involves distortion levels similar to those experienced in an amplifier operating at 300 kHz switching frequency insofar as a higher level of distortion is compensated, especially around 6-7 kHz when the current through the load L has an amplitude comparable with the ripple current.

Conversely, when operating with lower feedback factors, a (much) lower distortion (THD) can be achieved throughout the whole range of amplitudes and frequencies contemplated for the operation of the amplifier.

Figure 6:
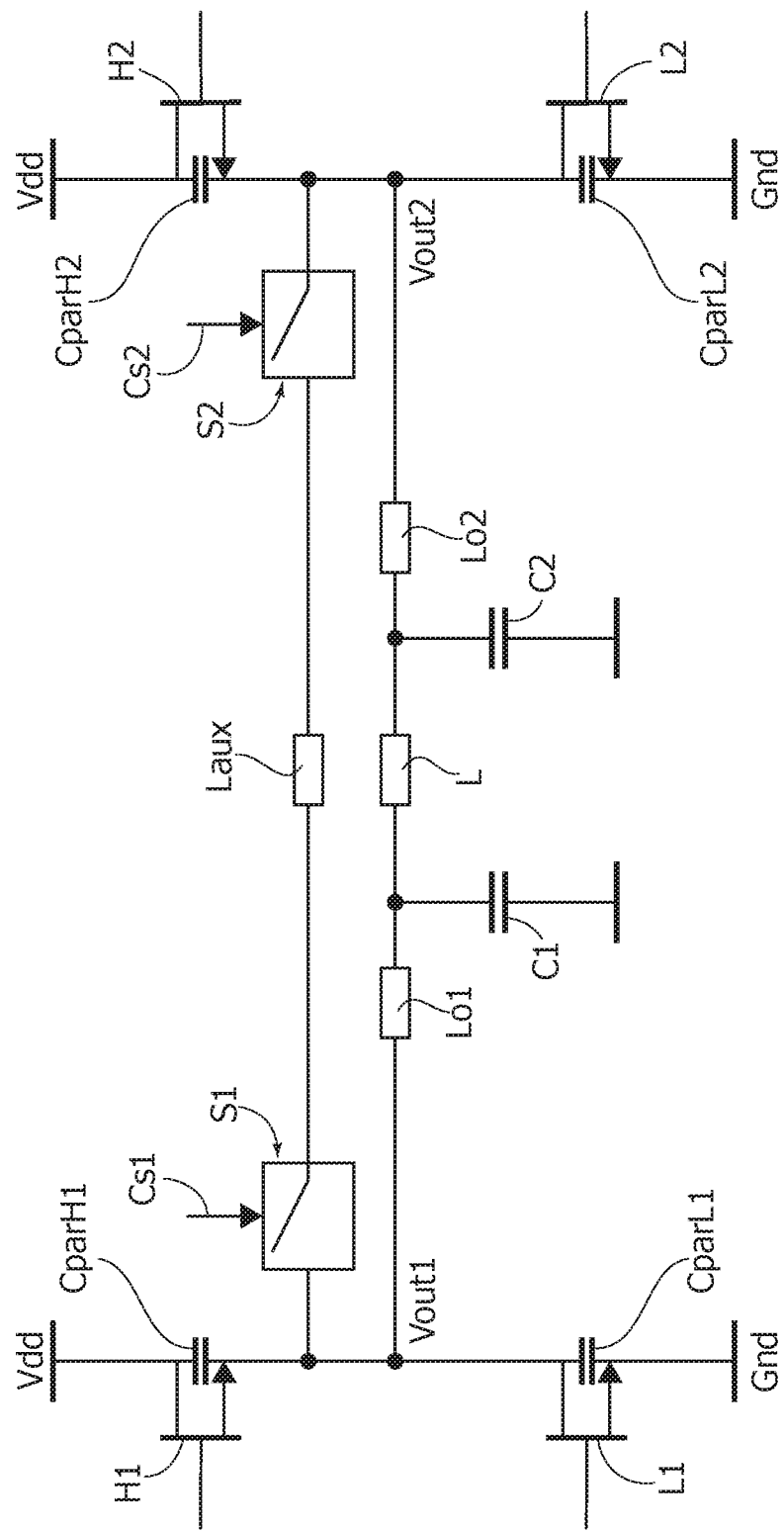

The circuit diagram of FIG. 6 reproduces the circuit diagram of FIG. 2 (by adopting the same designation of parts and elements reproduced) with the exception of the capacitances Caux1 and Caux2: the diagram of FIG. 6 is in fact exemplary of the possibility (already discussed) of exploiting the intrinsic (parasitic) capacitances of the power transistors H1, L1, H2, L2 (designated CparH1, CparL1, CparH2, CparL2) to play, at least in part, the same role of the capacitances Caux1 and Caux2 in providing resonance with Laux as desired.

One or more embodiments as exemplified in FIG. 6 facilitate reducing the number of possible additional components with respect to conventional circuitry.

In one or more embodiments, Laux may have an inductance value of a few 10 nH. Consequently (and, again, as already discussed previously) in one or more embodiments Laux can be provided (at least in part) by exploiting electrically conductive formations (e.g., tracks or lines) provided in the printed circuit board hosting the circuit.

Also, in one or more embodiments providing the inductance Laux may involve conventional techniques for integrating inductances in integrated circuits.

In the same line of FIG. 6, FIGS. 7 to 10 are exemplary of various possible implementation options of one or more embodiments, e.g., options which may facilitate avoiding that the terminals of Laux are not left floating when the switches S1, S2 are open (that is, non-conductive).

Like in FIG. 6, in FIGS. 7 to 10 parts or elements like parts or elements already discussed in the foregoing are indicated with like reference/numerals, so that a corresponding description will not be repeated here for brevity.

It will be otherwise understood that the various individual implementing options exemplified throughout the figures accompanying this description are not necessarily intended to be adopted in the same combinations exemplified in the figures. One or more embodiments may thus adopt these (otherwise non-mandatory) options individually and/or in different combinations with respect to the combination exemplified in the accompanying figures.

Figure 7:
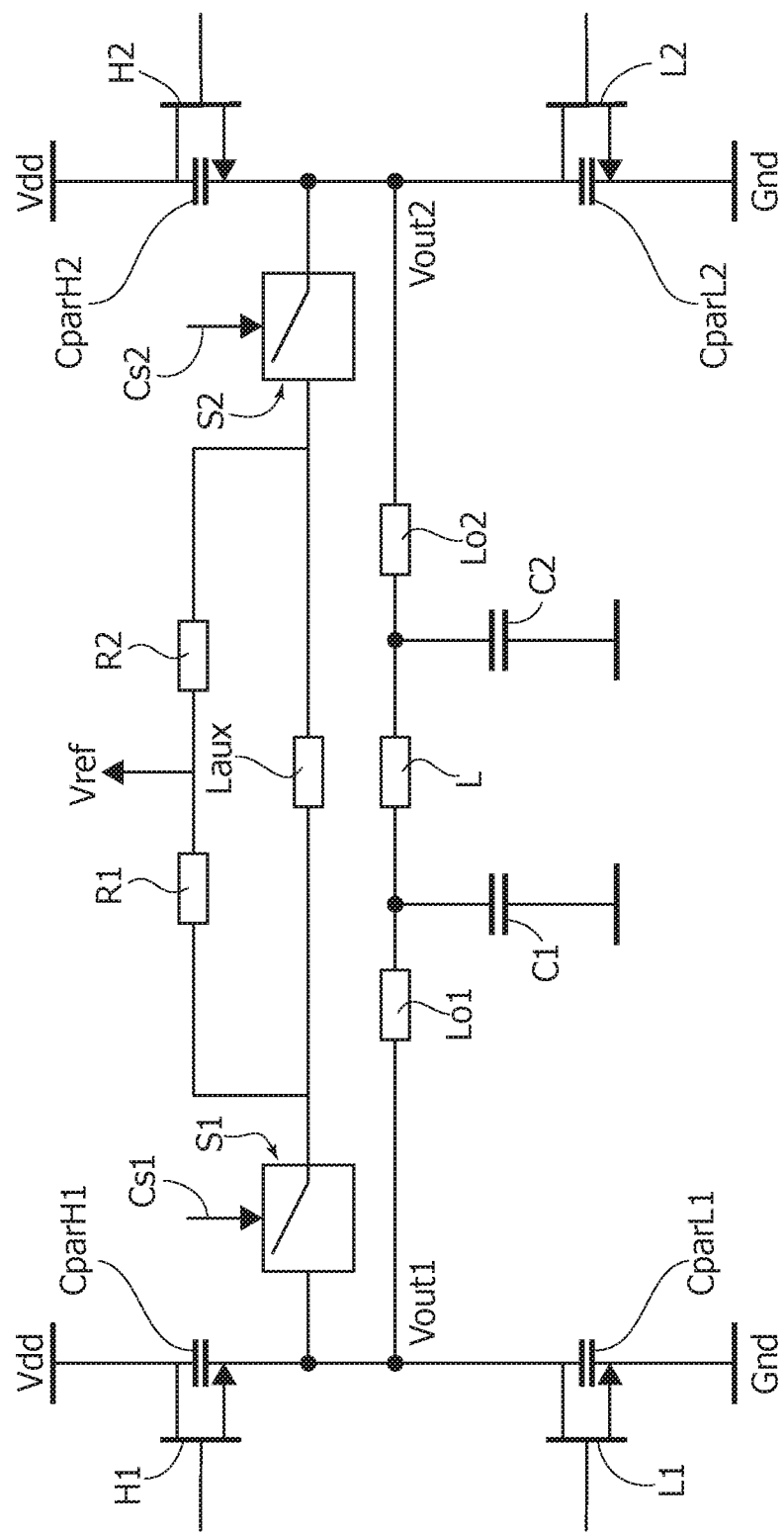

For instance, in the arrangement exemplified in FIG. 7 two resistors R1, R2 are provided coupling the terminals of Laux to a reference voltage node at a voltage Vref.

Figure 8:
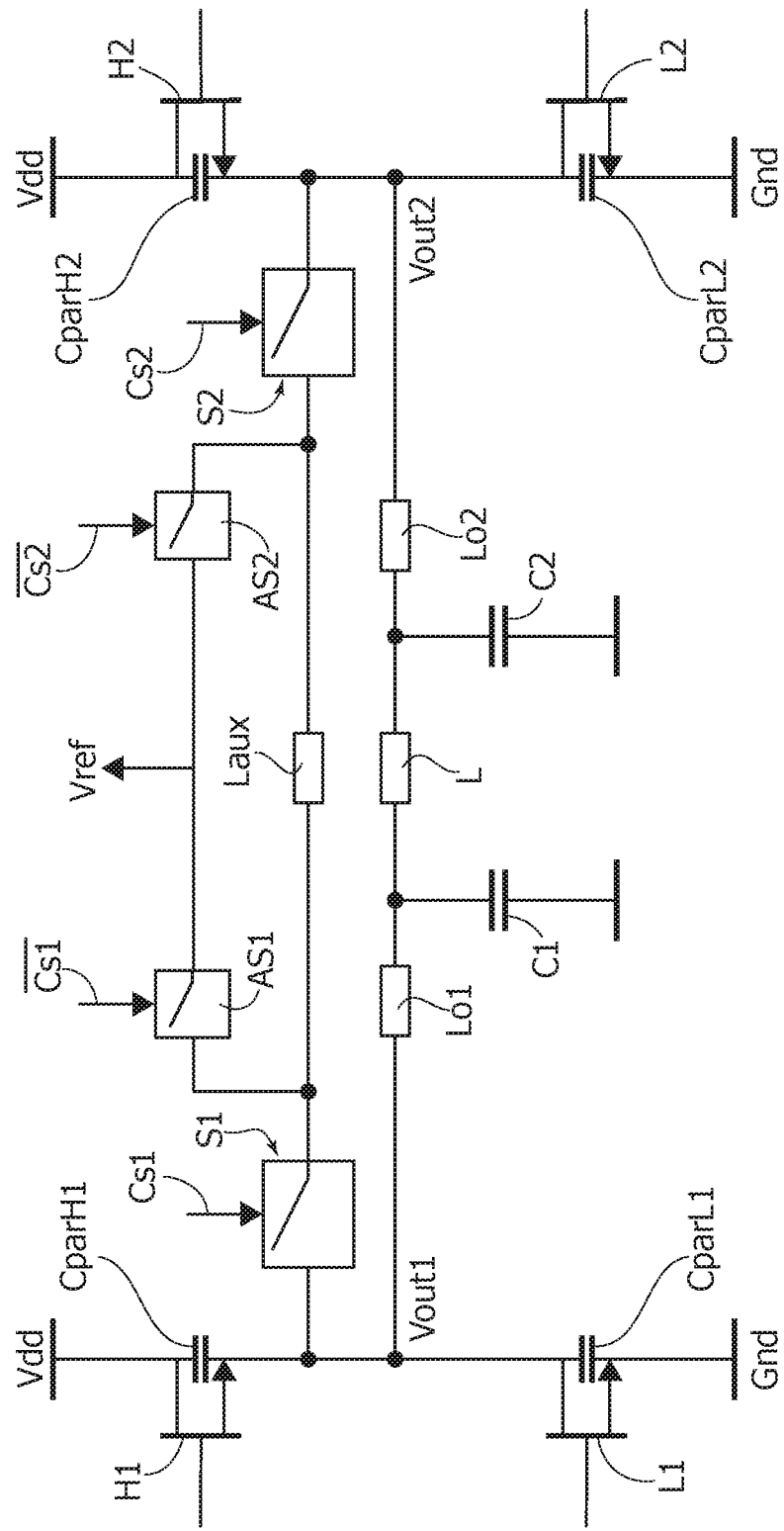

In the exemplary arrangement of FIG. 8, in order to avoid possible dissipation as resulting from the use of resistors R1, R2, two auxiliary switches AS1, AS2 are provided which are actuated via signals negated-Cs1 and negated-Cs2, complementary to the signals Cs1, Cs2 controlling the switches S1, S2 so that when the switches S1, S2 are open (non-conductive) the auxiliary switches AS1, AS2 are closed (conductive) thus coupling the terminals to of Laux to the reference level Vref.

Figure 9:
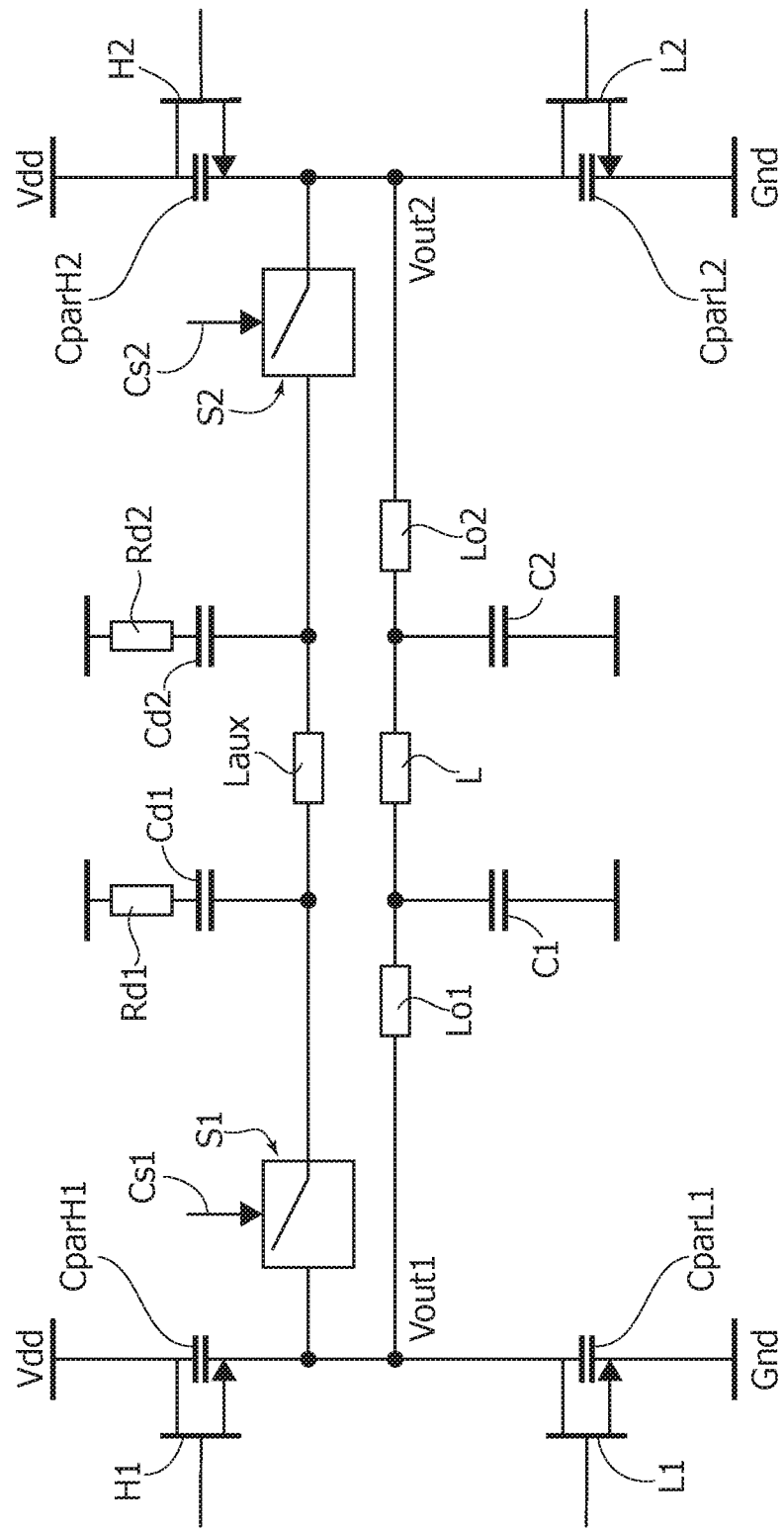
Figure 10:
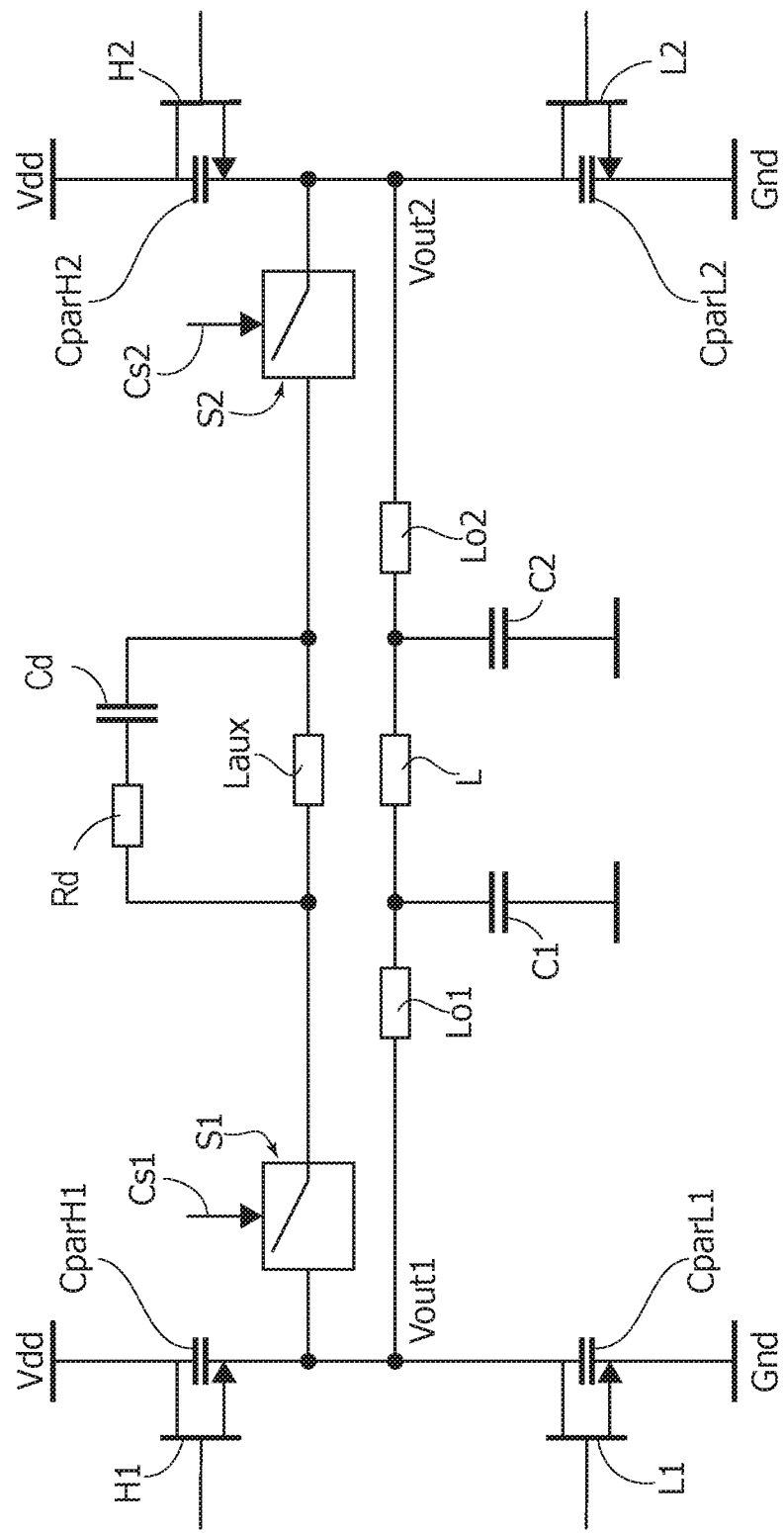

The diagrams of FIGS. 9 and 10 are exemplary of possible arrangements where the terminals of the inductance Laux are coupled to RC networks intended to dampen possible oscillations at the terminals of Laux.

As noted, these arrangements are not per se mandatory. They may however be helpful in (further) reducing possible electromagnetic emissions for electromagnetic interference (e.g., EMI) issues.

Throughout the previous description, operation of the switches S1, S2 has been assumed to correspond to an ideal behavior of these switches, that is with the capability for the switches S1 and S2 to be switched between an "off" (non-conductive) state and at least one "on" (conductive) state, with current flow through the switch indifferently facilitated in both directions in the conductive state of the switch.

Switches such as S1, S2 can be implemented, e.g., by resorting to conventional arrangements including two transistors (e.g., MOS transistors) in an anti-series (or back-to-back) arrangement.

These switches may give rise to certain issues related to the turn-off process.

In an arrangement as exemplified herein, a delayed turn off of the switches S1, S2 may result in a corresponding delay in the interruption of the current ILaux which—in order to increase efficiency—should desirably take place in the vicinity of zero values in order to avoid that current flow may desirably continue, e.g., as shown in dotted line in the right-hand side of FIG. 3F.

In one or more embodiments, the switches S1, S2 can be implemented according to the solution described in an Italian patent application filed on even date in the name of the same applicant.

As exemplified in FIG. 11, such a switch circuit 10 (which may be adopted for both S1 and S2) may include:

a first and a second (e.g., MOSFET) transistor M1, M2 having their control electrodes (e.g., gates, in the exemplary case of field effect transistors) coupled at a first common node A and the current paths therethrough (e.g., source-drain in the exemplary case of field effect transistors) coupled at a second common node B in an anti-series arrangement, a first electrical path between the first common node A and the current path through the first transistor M1 (at the terminal, e.g., drain) opposed the second transistor M2, the first electrical path comprising a first switch C1 switchable between a conductive state and a non-conductive state, a second electrical path between the first common node A and the current path through the second transistor (at the terminal, e.g., drain) opposed the first transistor, the second electrical path comprising a second switch C2 switchable between a conductive state and a non-conductive state, a third electrical path between the first common node A and the second common node B, the third electrical path comprising a third switch C3 switchable between a conductive state and a non-conductive state, and a logical network (e.g., a NAND gate 12) coupling the third switch C3 with the first and second switches C1, C2, the logical network configured to switch the third switch C3:

a) to the conductive state with both the first switch C1 and the second switch C2 switched to the non-conductive state, and b) to the non-conductive state with either one of the first switch C1 and the second switch C2 switched to the conductive state.

The circuit 10 of FIG. 11 may be selectively brought to:

an "off" operating condition, wherein the first and the second switches C1 and C2 are non-conductive, thereby impeding current flow in the current line between a first and a second electrical line nodes Va and Vb with the third switch conductive, either one of two "on" operating conditions a) or b) where:

a) the first switch C1 is conductive and the second switch C2 is non-conductive with the third switch C3 non-conductive, thereby facilitating current flow in the current line from Va to Vb, or b) the first switch C1 is non-conductive and the second switch C2 is conductive with the third switch C3 non-conductive, thereby facilitating current flow in the current line from Vb to Va.

Switching of such a switch circuit as exemplified in FIG. 11 may thus involve two control signals, namely Cs1, Cs2 so that, with both these signals at a first level (e.g., 0), the switch (e.g., S1, S2—see the basic exemplary diagram of FIG. 2) is in an open, non-conductive state.

Selectively controlling Cs1 and Cs2 with either one of the switches C1, C2 brought to a conductive state (while the switch C3 is non-conductive in both instances) makes the switch conductive (that is "closed") in the one or the other of the directions of current flow through Laux (see again the basic exemplary diagram of FIG. 2).

Figure 13:
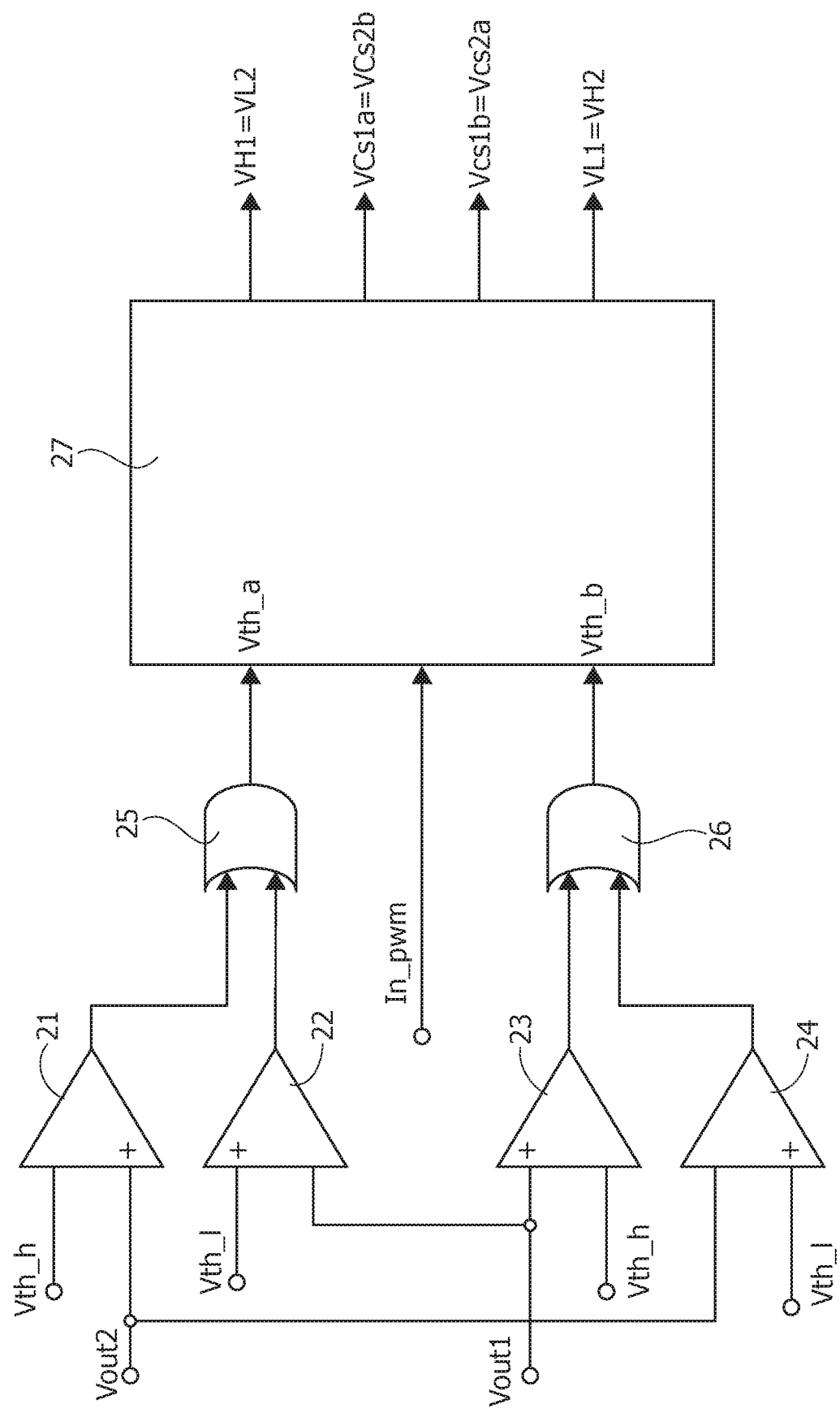
FIG. 13 is exemplary of a possible control arrangement in embodiments.

The time diagrams of FIGS. 12A-12G, the circuit diagram of FIG. 13 and the flowchart of FIG. 14 are exemplary of how time diagrams of FIG. 3A-3F, the circuit diagram of FIG. 4 and the flowchart of FIG. 5 may be adapted to manage two distinct control signals VCs2a, VCs2b, (for switch S1) and VCs1a, VCs1b (for switch S2) in the case the switches S1, S2 are implemented as exemplified in FIG. 11.

For the sake of brevity a complete corresponding description will not be repeated: the differences between FIGS. 12A-12G, and FIGS. 3A-3F, between FIG. 13 and FIG. 4 and between FIG. 14 and FIG. 5 will thus be primarily discussed.

In the diagrams of FIGS. 12A-12G, FIG. 3E is, so to say, split into FIGS. 12E and 12F showing a possible time behavior of the signals VCs1a=VCs2b and VCs2a=VCs1b that control turning on and off the switches S1, S2.

Using for switches S1, S2 a structure as exemplified in FIG. 11 makes it possible to render the switches S1 and S2 selectively conductive in either one of the flow directions of the current therethrough, namely in the one flow direction which under the circumstances facilitates discharging the charge Qrr of the body diode of L1.

This makes it possible to null the "contrary" current ILaux through the inductance Laux, during, e.g., the interval ta, tb.

The single control line from the circuit block 27 in FIG. 4 providing the control signals Vcs1=Vcs2 for the switches S1 and S2 is now split into two lines providing control Vcs1a=Vcs2b and Vcs1b=Vcs2a for respective circuits as exemplified in FIG. 11 for S1 and S2.

Here again, for the sake of explanation and by way of example it may be assumed that the transistors/switches are "on" (active/conductive) when the control signal is "high" and "off" (inactive/non-conductive) when the control signal is "low".

The flow chart in FIG. 14 is again exemplary of possible cyclical operation of an arrangement as discussed in the foregoing, starting to an initial condition where:

VL1=VH2=1 (that is, L1 and H2 conductive)
VH1=VL2=0 (that is, H1 and L2 non-conductive)
Vcs1a=VcS2b=0 and Vcs1b=Vcs2a=0 (that is, S1 and S2 non-conductive).

The blocks in the diagram of FIG. 14 identify the following acts:

100: check as to whether a transition (e.g., 0→1) has occurred in the input signal In_pwm (here again the suffixes 1 and 2 are not reproduced for the reasons given previously);

102: given a positive outcome in block 100, the currently active power transistors are turned off (e.g., VL1=VH2 1→0);

104': the switches CS1-CS2 are activated, that is made conductive (e.g., Vcs1b=Vcs2a 0→1);

106: check as to whether the "turn-off" threshold has been reached (e.g., Vth_a 0→1);

108': given a positive outcome in block 106, the switches S1, S2 are turned off, that is made non-conductive (e.g., Vcs1b=Vcs2a 1→0);

110: the currently inactive power transistors are turned on (e.g., VH1=VL2 1→0);

112: check as to whether a new transition has occurred in the input signal In_pwm;

114: given a positive outcome in block 112, the currently active power transistors are turned off (e.g., VH1=VL2 1→0);

116': the switches CS1-CS2 are activated, that is made conductive (e.g., Vcs1a=Vcs2b 0→1);

118: check as to whether the "turn-off" threshold has been reached (e.g., Vth_b 1→0);

120': given a positive outcome in block 118, the switches S1, S2 are turned off, that is made non-conductive (e.g., Vcs1a=Vcs2b 1→0);

122: the currently inactive power transistors are turned on (e.g., VL1=VH2 1→0); and so on.

One or more embodiments may thus facilitate reducing the power dissipated in switching with reduced (virtually none) external component needed to be added.

One or more embodiments may rely on the controlled discharge of the reverse recovery charge of the body diodes of the power transistors thus reducing current peaks and dead times, and, possibly, also the ensuing bouncing phenomenon of voltage across the inductances and the associated electromagnetic emissions.

One or more embodiments may facilitate achieving a reduced structure by resorting to coincident switch and power control signals.

One or more embodiments facilitate improved performance in terms of total harmonic distortion (THD).

In one or more embodiments a (switching) circuit may comprise:

a switching circuit stage comprising first (e.g., HB1) and second (e.g., HB2) half-bridges (each) comprising a first, high-side transistor (e.g., H1, H2) and a second, low-side transistor (e.g. L1, L2), the first half-bridge and the second half-bridge comprising respective output nodes (e.g., Vout1, Vout2) between the high-side transistor and the low-side transistor therein, the output nodes configured for supplying an electrical load (e.g., L) via respective filter networks (e.g., Lo1, C1; Lo2, C2) between the output nodes and the load (which per se may be distinct from the embodiments), control circuitry (e.g., 21 to 27) configured to control (e.g., VH1=VL2; VL1=VH2) alternate switching sequences (e.g., 100 to 110 and 112 to 122 in FIGS. 5 and 14) of the high-side and low-side transistors in the first and second half-bridges wherein a first pair of transistors comprising the high-side transistor in one of the half-bridges and the low-side transistor in the other of the half-bridges is switched to a non-conductive state, and (then, after a delay to avoid undesired cross-conduction) a second pair of transistors comprising the high-side transistor in the other of the half-bridges and the low-side transistor in the one of the half-bridges is switched to a conductive state, wherein the circuit comprises:

a current flow line between the output nodes in the first half-bridge and the second half bridge, the current flow line comprising an inductance (e.g., Laux) having opposed terminals coupled to a first switch (e.g., S1) and a second switch (e.g., S2), the first switch and the second switch selectively switchable between a non-conductive state and at least one conductive state, first and second capacitances (e.g., Caux1, Caux2; CparH1, CparL1, CparH2, CparL2) coupled with the output nodes of the first half-bridge and the second half-bridge (HB2), and the control circuitry configured to switch the first and second switches to the at least one conductive state at intervals (e.g., ta, tb; t1, t2) in the alternate switching sequences between switching the first pair of transistors to a non-conductive state and switching the second pair of transistors to a conductive state.

In one or more embodiments, the inductance may comprise:

a distinct inductive component of the circuit, and/or
an electrically-conductive line coupling the first switch and the second switch, the electrically-conductive line having a line inductance.

In one or more embodiments, the first and second capacitances may comprise:

distinct capacitive components of the circuit coupled between the output nodes of the first and second half-bridges and ground, and/or parasitic capacitances of the high-side and the low-side transistors in the first and second half-bridges.

One or more embodiments may comprise, coupled with the terminals of the inductance:

a dissipative resistive network (e.g., R1, R2) coupling the terminals of the inductance with a reference node (e.g., Vref), and/or first (e.g., AS1) and second (e.g, AS2) auxiliary switches configured to be conductive resp. non-conductive as a result of the first and the second switch being non-conductive resp. conductive, the first and second auxiliary switches, when conductive, coupling the terminals of the inductance with a reference node; and/or a low-pass filter network (e.g., Cd1, Rd1, Cd2, Rd2; Cd, Rd).

In one or more embodiments, the first and second switches may comprise switches switchable between a non-conductive state and a conductive state selected out of:

a first conductive state, wherein the first and second switches are conductive from the output node of the first half-bridge towards the output node of the second half bridge, and a second conductive state, wherein the first and second switches are conductive from the output node of the second half-bridge towards the output node (Vout1) of the first half bridge.

In one or more embodiments, the control circuitry may be configured to switch (see, e.g., the blocks 104'; 116' in FIG. 14) the first and second switches to the one of the first and second conductive states which facilitates discharging the body diode in one of the transistors, optionally the low-side transistor (e.g., L1 or L2), in the first pair of transistor switched to a non-conductive state in the alternate switching sequences.

In one or more embodiments, the control circuitry may be sensitive (e.g., at 21 to 24) to the voltages at the output nodes of the half-bridges and may be configured (see, e.g., the blocks 108, 120 in FIG. 5 and the blocks 108', 120' in FIG. 14) to switch the first (S1) and second (S2) switches to the non-conductive state at alternate first (e.g., tb) and second (e.g., t2) turn-off times as a result of the voltages:

increasing up to an upper threshold (e.g., Vth_h),
decreasing down to a lower threshold (e.g., Vth_l).

In one or more embodiments, a device (e.g., D, such as a class-D audio switching amplifier) may comprise:

a PWM modulator (e.g., PWMM) configured (e.g., FN, LF) to receive an input signal (e.g., I/V in) and to produce therefrom first (e.g., In_pwm1) and second (e.g., In_pwm2) PWM-modulated drive signals, a circuit according to one or more embodiments coupled with the PWM modulator with the first and second half-bridges configured to be driven by the first and second PWM-modulated drive signals, respective low pass filter networks (e.g., Lo1, C1; Lo2, C2) coupled to the output nodes of the first and second half-bridges.

One or more embodiments may comprise an electrical load (e.g., one or more loudspeakers, in the case of an audio amplifier) coupled to the circuit and supplied from the output nodes of the first and second half-bridges via the respective low pass filter networks.

A method of amplifying an input signal according to one or more embodiments may comprise:

applying an input signal to a PWM modulator in a device according to one or more embodiments, and obtaining an amplified replica of the input signal at the respective low pass filter networks coupled to the output nodes of the first and second half-bridges.

Without prejudice to the underlying principles, the details and embodiments may vary, even significantly, with respect to what has been described by way of example only without departing from the extent of protection.

The extent of protection is determined by the annexed claims.

What is claimed is:

1. A circuit comprising:
   a switching circuit stage comprising first and second half-bridges, each of the half-bridges comprising a high-side transistor, a low-side transistor, and an output node between the high-side transistor and the low-side transistor, wherein the output nodes of the first and second half-bridges are configured to supply power to a load via respective filter networks;
   a control circuit configured to control alternate switching sequences of the high-side and low-side transistors in the first and second half-bridges, wherein a first pair of transistors comprising the high-side transistor in one of the half-bridges and the low-side transistor in the other of the half-bridges is switched to a non-conductive state, and a second pair of transistors comprising the high-side transistor in the other of the half-bridges and the low-side transistor in the one of the half-bridges is switched to a conductive state;
   a current flow line between the output nodes of the first and the second half-bridges, the current flow line comprising an inductance having opposed terminals coupled to a first switch and a second switch, the first switch and the second switch selectively switchable between a non-conductive state and a conductive state; and
   first and second capacitances coupled with the output nodes of the first and the second half-bridges, wherein the control circuit is configured to switch the first and second switches to the a conductive state at intervals in the alternate switching sequences between switching the first pair of transistors to a non-conductive state and switching the second pair of transistors to a conductive state.

2. The circuit of claim 1, wherein the inductance comprises a discrete inductor.

3. The circuit of claim 1, wherein the inductance comprises an electrically-conductive line coupling the first switch and the second switch, the electrically-conductive line having a line inductance.

4. The circuit of claim 1, wherein the first and second capacitances comprise discrete capacitive components coupled between the output nodes of the first and second half-bridges and ground.

5. The circuit of claim 1, wherein the first and second capacitances comprise parasitic capacitances of the high-side and low-side transistors of the first and second half-bridges.

6. The circuit of claim 1, further comprising a dissipative resistive network coupling the opposed terminals of the inductance with a reference node.

7. The circuit of claim 1, further comprising:
a first auxiliary switch coupled between a first terminal of the inductance and a reference node, the first auxiliary switch configured to be conductive as a result of the first switch being non-conductive; and
a second auxiliary switch coupled between a second terminal of the inductance and the reference node, the second auxiliary switch configured to be conductive as a result of the second switch being non-conductive.

8. The circuit of claim 1, further comprising a low-pass filter network coupling the opposed terminals of the inductance with a reference node.

9. The circuit of claim 1, wherein the first and the second switches comprise switches switchable between a non-conductive state and a conductive state selected out of:
a first conductive state, wherein the first and second switches are conductive from the output node of the first half-bridge towards the output node of the second half-bridge, and
a second conductive state, wherein the first and second switches are conductive from the output node of the second half-bridge towards the output node of the first half bridge.

10. The circuit of claim 9, wherein the control circuit is configured to switch the first and second switches to one of the first and second conductive states to facilitate discharging a body diode of one of the transistors in the first pair of transistor switched to a non-conductive state in the alternate switching sequences.

11. The circuit of claim 1, wherein the control circuit is sensitive to voltages at the output nodes of the first and second half-bridges, the control circuit configured to switch the first and second switches to the non-conductive state at alternate first and second turn-off times as a result of the voltages at the output nodes of the first and second half-bridges increasing up to an upper threshold or decreasing down to a lower threshold.

12. A device comprising:
a PWM modulator configured to receive an input signal and to produce first and second PWM signals based on the input signal; and
a circuit coupled with the PWM modulator, the circuit comprising:
a switching circuit stage comprising first and second half-bridges configured to be driven by the first and second PWM signals, each of the half-bridges comprising a high-side transistor, a low-side transistor, and an output node between the high-side transistor and the low-side transistor,
respective low pass filter networks coupled to the output nodes of the first and second half-bridges and configured to be coupled to a load, wherein the output nodes of the first and second half-bridges are configured to supply power to the load via the respective filter networks,
a control circuit configured to control alternate switching sequences of the high-side and low-side transistors in the first and second half-bridges, wherein a first pair of transistors comprising the high-side transistor in one of the half-bridges and the low-side transistor in the other of the half-bridges is switched to a non-conductive state, and a second pair of transistors comprising the high-side transistor in the other of the half-bridges and the low-side transistor in the one of the half-bridges is switched to a conductive state,
a current flow line between the output nodes of the first and the second half-bridges, the current flow line comprising an inductance having opposed terminals coupled to a first switch and a second switch, the first switch and the second switch selectively switchable between a non-conductive state and a conductive state, and
first and second capacitances coupled with the output nodes of the first and the second half-bridges, wherein the control circuit is configured to switch the first and second switches to the a conductive state at intervals in the alternate switching sequences between switching the first pair of transistors to a non-conductive state and switching the second pair of transistors to a conductive state.

13. The device of claim 12, further comprising the load.

14. A method of operating a class-D amplifier, the method comprising:
receiving an input signal;
generating a PWM signal based on the input signal;
alternatively switching first and second half-bridges of the class-D amplifier in an alternate switching sequence based on the PWM signal, the half-bridges having respective output nodes coupled to a load via respective filter networks, wherein alternatively switching the first and second half-bridges in the alternate switching sequence comprises:
turning on a first pair of transistors of the half-bridges when a second pair of transistors of the half-bridges is off, and
turning on the second pair of transistors when the first pair of transistors is off, wherein the first pair of transistors comprises a high-side transistor in one of the half-bridges and a low-side transistor in the other of the half-bridges, and the second pair of transistors comprises a high-side transistor in the other of the half-bridges and a low-side transistor in the one of the half-bridges; and
turning on a first switch coupled to the output node of the first half-bridge and a second switch coupled to the output node of the second half-bridge at intervals in the alternate switching sequence between turning off the first pair of transistors and turning non the second pair of transistors, wherein an auxiliary inductance is coupled between the first switch and the second switch.

15. The method of claim 14, wherein the PWM signal is a fixed frequency signal.

16. The method of claim 15, wherein the fixed frequency signal has a frequency between 2 MHz and 2.5 MHz.

17. The method of claim 14, wherein the first and second switches are further coupled to a reference voltage node via respective resistors.

18. The method of claim 14, wherein the first and second switches are further coupled to a reference voltage node via respective third and fourth switches, the method further comprising:
- turning on the third switch when the first switch is off and turning off the third switch when the first switch is on; and
- turning on the fourth switch when the second switch is off and turning off the fourth switch when the second switch is on.

19. The method of claim 14, wherein the first and second switches are further coupled to a reference voltage node via respective low-pass filters.

20. The method of claim 14, wherein a capacitor and a resistor are coupled in series between the first and second switches.

* * * * *